United States Patent [19]
Garg et al.

[11] Patent Number: 5,147,687
[45] Date of Patent: Sep. 15, 1992

[54] HOT FILAMENT CVD OF THICK, ADHERENT AND COHERENT POLYCRYSTALLINE DIAMOND FILMS

[75] Inventors: Diwakar Garg; Sui-Yuan Lynn, both of Macungie; Robert L. Iampietro, Emmaus; Ernest L. Wrecsics, Bethlehem; Paul N. Dyer, Allentown, all of Pa.

[73] Assignee: Diamonex, Inc., Allentown, Pa.

[21] Appl. No.: 707,984

[22] Filed: May 22, 1991

Related U.S. Application Data

[62] Division of Ser. No. 582,517, Sep. 13, 1990, abandoned.

[51] Int. Cl.⁵ .............................................. C23C 16/26
[52] U.S. Cl. ..................................... 427/249; 427/50; 427/49; 427/122; 427/255.7; 427/255.1; 427/314; 428/408
[58] Field of Search ...................... 427/249, 122, 255.7, 427/255.1, 50, 49, 314; 428/408; 423/446

[56] References Cited

U.S. PATENT DOCUMENTS

| | | | |
|---|---|---|---|
| 4,333,986 | 6/1982 | Tsuji et al. | 428/408 |
| 4,434,188 | 2/1984 | Kamo et al. | 427/39 |
| 4,643,741 | 2/1987 | Yu et al. | 51/255 |
| 4,698,256 | 10/1987 | Giglia et al. | 428/408 |
| 4,707,384 | 11/1987 | Schachner et al. | 428/408 |
| 4,725,345 | 2/1988 | Sakamoto et al. | 428/408 |
| 4,731,296 | 3/1988 | Kikuchi et al. | 428/408 |
| 4,734,339 | 3/1988 | Schachner et al. | 428/701 |
| 4,816,286 | 3/1989 | Huose | 427/39 |
| 4,849,290 | 7/1989 | Fujimori et al. | 428/408 |
| 4,859,490 | 8/1989 | Ikega et al. | 427/38 |
| 4,873,115 | 10/1989 | Matsumura et al. | 427/34 |
| 4,900,628 | 2/1990 | Ikega et al. | 428/408 |
| 4,925,701 | 5/1990 | Jansen et al. | 427/38 |
| 4,988,421 | 1/1991 | Drawl et al. | 204/192.3 |

FOREIGN PATENT DOCUMENTS

61-106494 5/1986 Japan .
62-196371 8/1987 Japan .
62-142076 12/1988 Japan .
63-307196 12/1988 Japan .
62-180060 1/1989 Japan .

OTHER PUBLICATIONS

Kobashi et al "Synthesis of diamond by use of microwave plasma CVD: Morphology growth of diamond films, " Aug. 15, 1988 vol. 38, No. 6 Physical Review pp. 4067–4084.
Matsumoto et al "Chemical Vapor Deposition of Diamond from Methane-Hydrogen gas" Pro 7th CVM, 1982, pp. 386–391.
Hirose et al "Synthesis of Diamond Thin Films by Thermal CVD Using Organic Compounds" vol. 25, No. 6, Jun. 1986, pp. 519–521.
Matsumoto et al "Growth of diamond particles from $CH_3Hgas$" Jou of Nat'l Scie 17 (1982) 3106-3112.
Singh et al "Hollow cathode plasma assisted CVD of diamond" App Phy. Lett 52(20) May 16, 1988.
Sawabe et al "Growth of Diamond Thin Films in a DC discharge Plasma" Applied Surface Sci. 33/34 (1988) 539–545.

Primary Examiner—Michael Lusignan
Assistant Examiner—Roy V. King
Attorney, Agent, or Firm—McCubbrey, Bartels, Meyer & Ward

[57] ABSTRACT

A thick, adherent and coherent polycrystalline diamond (PCD) coated substrate product is disclosed which comprises either a metallic or ceramic substrate and a plurality of separately deposited PCD layers of substantially uniform microstructure and having high electrical resistivity. The method for depositing multi-layers of PCD film onto the substrate comprises chemically depositing at least two separate polycrystalline diamond layers onto the substrate deposition conditions which are substantially different between cycles. The method enables one to deposit PCD films having a thickness of at least 12 microns for applications on flat as well as curved substrates having wide use in the electronics industry. Thick PCT films of this invention have been found to be ideal for dissipating heat from radio frequency (RF) and microwave (MW) devices.

28 Claims, 6 Drawing Sheets

HOT FILAMENT CVD OF THICK, ADHERENT AND COHERENT POLYCRYSTALLINE DIAMOND FILMS

This application is a divisional application of U.S. application Ser. No. 582,517, filed Sep. 13, 1990, now abandoned.

FIELD OF THE INVENTION

This invention relates generally to the manufacture of polycrystalline diamond (PCD) coated substrates having particular application in integrated circuit devices. More particularly, the invention relates to a coated substrate product comprised of a plurality of thick, adherent and coherent polycrystalline diamond (PCD) layers deposited on a substrate having high electrical resistivity, and to a method for producing same.

BACKGROUND OF THE INVENTION

A number of chemical vapor deposition (CVD) techniques including hot filament CVD (HFCVD), RF plasma assisted CVD, microwave plasma assisted CVD, DC plasma assisted CVD and laser assisted CVD methods have been used to deposit thin (1–10 μm), adherent and coherent PCD films on a variety of substrates. However, these methods have not been successful in depositing thick ($\geq 12$ μm) PCD films adherently and coherently on metal and ceramic substrates. Furthermore, the films deposited by these techniques have been found to have poor electrical properties, making them unsuitable for the electronics industry.

The electrical properties of PCD films can be greatly improved by depositing them with enhanced crystal orientation in the (220) and (400) planes, as disclosed in a commonly assigned copending patent application, U.S. Pat. Ser. No. 497,161, filed Mar. 20, 1990, now abandoned. These PCD films have been successfully deposited at low as well as high rates on metallic substrates such as molybdenum and ceramics such as silicon with good adhesion. The adhesion has been shown to be extremely good as long as the film thickness is limited to ~10 μm. Although it is possible to deposit thicker films (>10 μm) at high rates both and silicon, their adhesion to these substrates has been noted to be poor. The PCD films on molybdenum have been found to simply flake off during cooling of the coated specimens from the deposition temperature to room temperature. Likewise, the films on silicon have been noted to be under high stress, causing the coated silicon to disintegrate into pieces. The disadvantages of such thick PCD films are set forth more fully below.

Several attempts have been made by researchers to deposit thick PCD films on metallic and ceramic substrates with limited success. The differences between the coefficients of thermal expansion of diamond and metals cause the thick films to separate from metallic substrates as the coated substrates cool from deposition temperature to room temperature, as reported by Peter Taborek in a recent paper entitled, "Optical Properties of Microcrystalline CVD Diamond," published in SPIE, Vol. 1112, Window and Dome Technologies and Materials, 205–209 (1989).

The thick films have, however, been reported to adhere well to silicon substrate, but they have been found to be under high stress (apparent from the resulting curvature of the substrate). In some cases the stress is great enough to cause the sample to disintegrate into pieces, as reported by D. Morrison and J. A. Savage in a paper entitled, "Optical Characteristics of Diamond Grown by Plasma Assisted Chemical Vapor Deposition," published in SPIE, Vol. 1112, Window and Dome Technologies and Materials, 186–191 (1989). Therefore, there is a need to develop technology to deposit thick PCD film adherently and coherently on metallic and ceramic substrates.

Japanese Kokai Patent No. Sho 63(1988)-307196, published Dec. 14, 1988, discloses a microwave plasma assisted CVD method of manufacturing multi-layered PCD film preferentially oriented in the (220) crystalline direction. In this patent application, the diamond deposition conditions such as the concentration of methane in hydrogen are changed continuously or discontinuously to deposit distinct diamond layers with different properties. For example, the first layer of the microcrystal diamond film with ~0.1 μm thickness is formed using high concentrations of methane in hydrogen (such as 2%). The second layer is deposited on the first layer with good crystallinity using low concentrations of methane in hydrogen (such as 0.3%). This application does not disclose a method of depositing thick, uniform, adherent and coherent PCD film on a substrate.

U.S. Pat. No. 4,816,286 discloses an HFCVD method for depositing PCD film to a thickness as high as 28 μm on various substrates at deposition rates of about 3 μm per hour and higher; see Examples 1–8 starting at column 5, line 48 through Table 1 bridging columns 7 and 8. It has been found that at this rate of deposition the adhesion of PCD films to the substrates is poor.

Thin (~10 μm) PCD films are suitable for many applications including low-power, direct-current, or low-frequency devices for dissipating heat from the devices as well as for isolating the devices from the base materials. They are, however, not suitable for high-frequency and/or high-power devices with large areas because of their high capacitance. The desired value of capacitance for these devices is $\leq 3$pF, requiring the use of thick PCD films for these applications. The thickness of a PCD film required for a particular application depends largely upon the device area and can be calculated by the following expression:

$$C = E_o K \frac{A}{t}$$

where:
  C = capacitance of PCD film in pF
  K = dielectric constant of PCD film (assumed to be 5.5 for diamond)
  A = device or chip area (cm$^2$)
  t = PCD film thickness (cm)
  $E_o$ = free-space permittivity (8.85×10$^{-2}$ pF/cm)

A relationship between PCD film thickness and device or chip area can thus be established by plugging in the values of $E_o$, K and desired capacitance in the above equation. The relationship between film thickness and device area can therefore be represented by the following expression:

$$t \geq 0.162 A$$

This expression can be used to calculate the thickness of PCD film required for devices having different areas, and the calculated values are summarized below.

| Device Area, cm$^2$ | | | | | | | |
|---|---|---|---|---|---|---|---|
| $1.1 \times 10^{-3}$ | $10 \times 10^{-3}$ | $15 \times 10^{-3}$ | $20 \times 10^{-3}$ | $25 \times 10^{-3}$ | $30 \times 10^{-3}$ | $50 \times 10^{-3}$ | $80 \times 10^{-3}$ |
| 2 | 16 | 24 | 32 | 41 | 49 | 81 | 130 |

Film Thickness, μm

These values indicate that ~10 μm thick PCD films will be suitable only for devices with area $<10 \times 10^{-3}$ cm$^2$. The devices commonly used by the electronics industry have areas $\geq 10 \times 10^{-3}$ cm$^2$, suggesting that the film thickness has to be $\geq 16$ μm to meet capacitance requirement. Therefore, there is a need for depositing thick PCD films on metallic and ceramic substrates with good adhesion and electrical properties. Further, the surface finish of polycrystalline diamond films can also be enhanced over that of prior art PCD films by depositing diamond crystals with enhanced orientation in at least two directions. This is an important feature in regard to mounting the device on the PCD film.

SUMMARY OF THE INVENTION

The improved multi-layer composite structure of the present invention substantially reduces or eliminates the disadvantages and shortcomings associated with the prior art structures. The invention discloses a coated substrate product comprised of a parent substrate and plurality of separate CVD polycrystalline diamond layers of substantially uniform microstructure and having high electrical resistivity. The layers are deposited using deposition conditions which are substantially different between each cycle. In one embodiment of the present invention, the deposition temperatures are alternated such that at least a 25° C. temperature difference exists between each cycle. In another embodiment of the present invention, the deposition pressures are alternated such that at least a 10 Torr pressure difference exists between each cycle.

The invention also comprises a method for fabricating the multi-layered product. According to the method, the plurality of polycrystalline diamond layers are chemical vapor deposited by an HFCVD technique on metallic and ceramic substrates.

In a more specific embodiment of the present invention, the PCD film is chemical vapor deposited on metallic and ceramic substrates by alternating either the deposition temperatures or deposition pressures in the HFCVD technique, such that the PCD film is deposited with an enhanced crystal orientation, excellent electrical properties, and surface finish. The intensity of (HKL) reflection in the (220) or (311) direction and the (400) direction relative to (111) direction of the PCD films of the present invention are enhanced over that of indistinct grade of diamonds. The diamond films of this invention exhibit particularly high electrical resistivity.

BRIEF DESCRIPTION OF THE DRAWINGS

Further features and advantages of the present invention will become apparent from the following and more particular description of the preferred embodiment of the invention as illustrated in the accompanying drawings, in which.

DETAILED DESCRIPTION OF THE INVENTION

Figure 1:
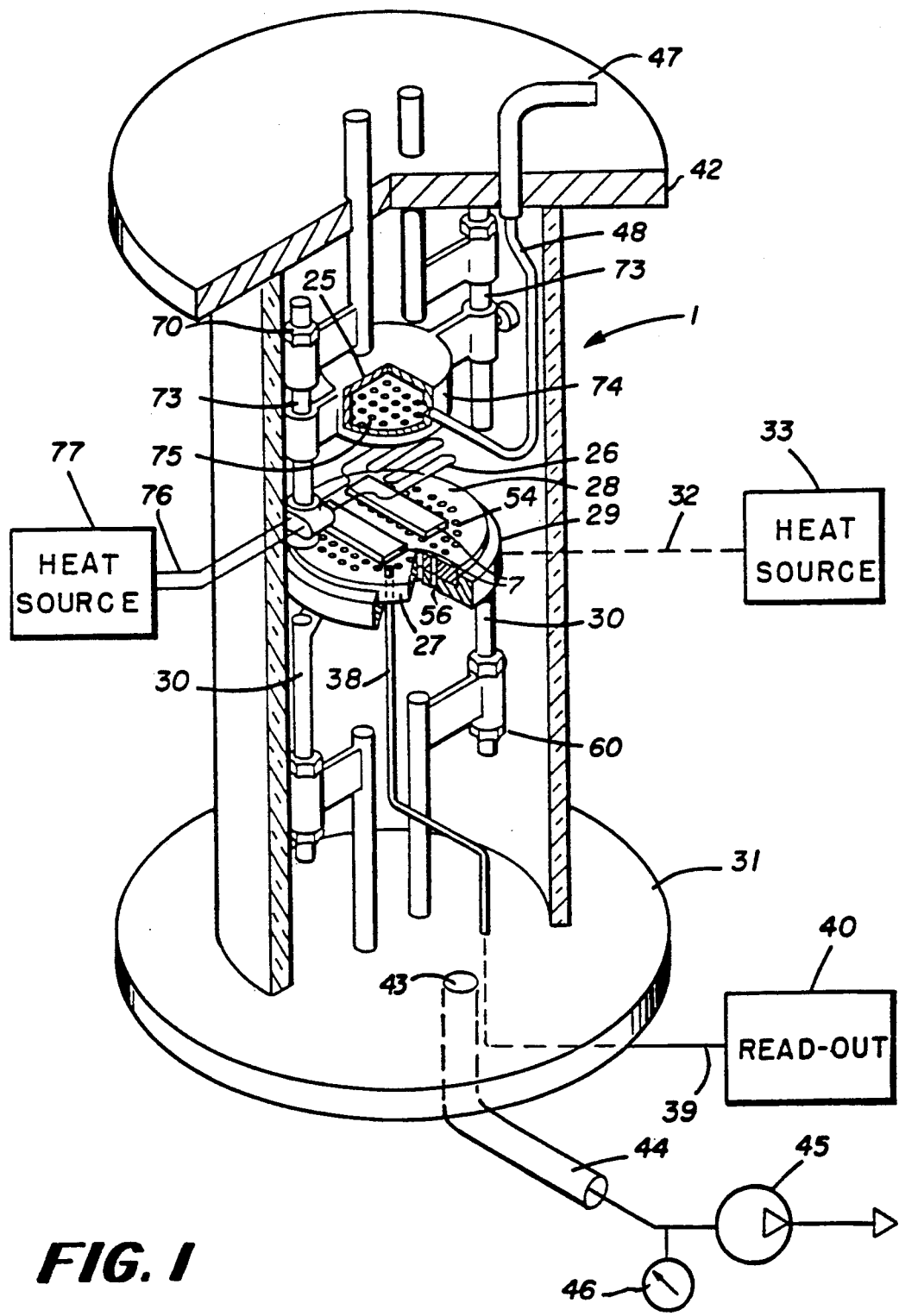
FIG. 1 is a simplified sectional view of a type of HFCVD reactor for use in carrying out the method of the present invention.

Thick PCD films can be deposited by carefully manipulating the build-up of stresses in the films. The build-up of stresses in the thick PCD films are controlled by employing one of the following methods:

(1) using low deposition rates ($<0.4$ μm/hr.), which method and the resulting composition is disclosed and claimed in copending patent application, Ser. No. 582,439, filed Sep. 13, 1990;

(2) periodically interrupting the deposition process by subjecting the coated substrate with a cool-down step, i.e. a step in which the coated substrate is cooled to temperatures substantially below the deposition temperatures, which method and resulting composition is disclosed and claimed in the copending patent application, Ser. No. 582,515, filed Sep. 13, 1990; or (3) cycling the deposition temperature or other deposition parameters during the deposition of the PCD films, which method and resulting composition is disclosed and claimed herein.

Each of these methods have been found to result in altering the microstructure of the PCD films, thereby helping in depositing thick films with reduced stresses. The thick films deposited by using these methods have been demonstrated to have good surface finish, adhesion and electrical properties.

The composition of the present invention is a multilayered composite structure which comprises a parent substrate and a plurality of polycrystalline diamond layers. The substrate on which diamond film is deposited comprises a single crystal such as diamond, silicon carbide, silicon, sapphire, and similar materials; a polycrystalline material such as silicon; a metal such as tungsten, molybdenum, titanium, tantalum, copper, and the like; a mixture of metals such an tungsten and molybdenum, tungsten and copper, molybdenum and copper, and the like; a ceramic material such as hot pressed, sintered or chemically vapor produced ceramics including silicon carbide, silicon nitride, polycrystalline diamond, cemented carbides, alumina, and the like or mixtures thereof. The substrate may contain various other layers and structures which constitute integrated circuitry. Such layers and structures may be formed before or after the application of the plurality of polycrystalline diamond layers.

Preferably the PCD layers are chemically vapor deposited on the substrate by means of a cyclic deposition technique such that the diamond layers exhibit enhanced crystal orientation in the (22) or (311) and (400) directions. In particular the intensity of (HKL) reflection in the (220) and (400) directions in the films of the present invention are at least 47 and 12 percent, respectively, relative to (111) intensity, which is normalized to 100. The resulting structure thus enables the isolation of circuits and silicon devices from one another and from the base substrate via superior electrical properties of the polycrystalline diamond film and exhibits a superior surface finish by substantially reducing the faceted crystals.

In the preferred embodiment of the invention, the polycrystalline diamond layers are chemically vapor deposited on a single crystal, a polycrystalline material, a hard metal, mixtures of metals, ceramic substrates or mixtures thereof, such that the polycrystalline diamond film exhibits enhanced crystal orientation in either the (220) or the (311) direction and the (400) direction over that of industrial grade diamonds.

By the phrase "chemically vapor deposited," it is meant the deposition of a layer of polycrystalline diamond resulting from the thermal decomposition of a mixture of hydrogen and carbon compounds, preferably hydrocarbons, into diamond generating carbon atoms preferentially from the gas phase activated in such a way as to avoid substantially the deposition of graphitic carbon. The specific types of carbon compounds useful in this method include $C_1$-$C_4$ saturated hydrocarbons such as methane, ethane, propane and butane; $C_1$-$C_4$ unsaturated hydrocarbons such as acetylene, ethylene, propylene and butylene; gases containing C and 0 such as carbon monoxide and carbon dioxide; aromatic compounds such as benzene, toluene, xylene, and the like; and organic compounds containing C, H, and at least one of oxygen and/or nitrogen such as methanol, ethanol, propanol, dimethyl ether, diethyl ether, methylamine, ethylamine, acetone, and similar materials (a detailed list of organic compounds that can be used to deposit a diamond layer with enhanced crystal orientation is provided in U.S. Pat. No. 4,816,286, which patent is incorporated herein by reference). The organic compound can be in admixture with water as described in Japanese Kokai Patent No. Sho 64(1989)24093, published Jan. 26, 1989. The concentration of carbon compounds in the hydrogen gas can vary from about 0.1% to about 5%, preferably from about 0.2% to 3%, and more preferably from about 0.5% to 2%. The resulting diamond film in such a deposition method is in the form of adherent individual crystallites or a layer-like agglomerates of crystallites substantially free from intercrystalline adhesion binders.

The total thickness of the plurality of polycrystalline diamond layers can be at least about 12 $\mu$m. Preferably, the total thickness of the diamond layers is about 12 $\mu$m to 250 $\mu$m. Still more preferably, it is about 25 $\mu$m to about 130 $\mu$m.

The polycrystalline diamond films of the present invention may be deposited in the preferred method by using an HFCVD reactor such as reactor 1 illustrated in FIG. 1. The HFCVD technique involves activating a feed gaseous mixture containing a mixture of hydrocarbon and hydrogen by a heated filament and flowing the activated gaseous mixture over a heated substrate to deposit a first layer polycrystalline diamond film during the first of two alternating deposition temperature cycles of at least one set of cycles. Alternatively, the deposition temperatures may remain constant and the pressures may be alternated for at least one set of cycles. The feed gas mixture, containing from 0.1 to about 5% hydrocarbon in hydrogen, is thermally activated under sub-atmosphere pressure ($\leq$100 torr) to produce hydrocarbon radicals and atomic hydrogen by using a heated filament made of W, Ta, Mo, Re or a mixture thereof. The filament is electrically heated to a temperature ranging from about 1800° to 250° C. The substrate on which the first layer of PCD film is to be deposited is heated to a temperature ranging from about 650° to 825° C. The control of substrate or deposition temperature at or below 825° C. is critical for depositing polycrystalline diamond films with enhanced crystal orientation, excellent electrical properties, and excellent surface finish. The use of deposition temperatures above 825° C. has been found to result in polycrystalline diamond crystals with random orientation. The use of deposition temperatures below 650° C., on the other hand, has been found to result in deposition of diamond films at extremely low and impractical rates.

After a period of at least 3 hours of polycrystalline diamond deposition time for the first cycle, the electrical charge of the filament is controlled in such a manner that there is a minimum $\Delta T$ of 25° C. in the deposition temperature from that used in the first cycle. Alternatively, the deposition temperatures may remain constant and the deposition pressure may be varied by at least 10 Torr. The second cycle is continued for at least an additional 3 hours. The HFCVD sets of alternating cycles are continued if the desired total thickness of PCD is not achieved after one set.

The deposition temperature in the second cycle can be higher or lower by at least 25° C. than the first cycle, as long as it is less than 825° C. and greater than 650° C. Alternatively, the deposition pressure in the second cycle can be higher or lower by at least 10 Torr than the first cycle, as long as it is less than 100 Torr and greater than 20 Torr.

When the desired thickness has been achieved, the reactive gaseous mixture is stopped and an inert gas, i.e. argon, helium and the like, is passed over said coated substrate while the filament remains electrically charged for a period of time to purge the activated gaseous mixture from the reactor and then the coated substrate is cooled by removing the charge from the filament while continuing to pass the inert gas over the substrate.

Referring now to FIG. 1, HFCVD reactor 1 for chemical vapor depositing a first layer of a PCD film onto substrates 7 and then for depositing at least an additional layer at substantially different deposition conditions onto the coated substrates comprises a gas dispersion system 25, a filament network 26 and an apertured support plate 27. Gas dispersion system 25 and apertured support plate 27 are oriented within reactor 1 so that their surfaces are perpendicular to the axis of the gas flow through the reaction zone 28. Substrates 7 to be coated are supported by the apertured support plate 27 which rests on an apertured substrate heater 29. Substrate heater 29 is attached to adjustable rods 30, which are mounted to the reactor base 31. Substrate heater 29 is provided with lead 32 to which an electrical heating current is conducted from a suitable heat source 33. Substrate heater 29 is also provided with a thermocouple 38 to measure substrate temperature and a connecting electrical lead 39 through which the thermocouple output is transmitted to an external read-out or recorder/controller 40. To accurately record and control the temperature of the plurality of substrates 7 within the critical range of the method of the present invention, the tip of the thermocouple 38 is placed immediately adjacent to the top surface of one of the substrates, as shown in FIG. 1.

The ends of reactor 1 are enclosed by removable bottom plate 31 and top plate 42 which isolate reactor 1 such that the interior can be evacuated without significant inward leakage from the surrounding ambient atmosphere. In order to regulate the gas pressure within reactor zone 28 and remove reaction product gases, bottom plate 31 is provided with an opening 43 therein through which an exhaust port tube 44 is suitably connected to a vacuum pump 45. A vacuum gauge 46 is connected in the line thereto for indicating the pressure within the reactor chamber. By properly operating the vacuum pump 45, the gas pressure within the reactor chamber may be regulated as desired.

A gas inlet tube 47 is provided which extends through top plate 42. Gas inlet tube 47 is suitably connected to gas dispersion system 25 by means of a gas feed line 48. Gas inlet tube 47 is connected to a gas feed system (not shown) to introduce reactant gases into the reactor at desired flow rates.

Support plate 27 contains apertures 54 and heater 29 contains apertures 56 in heater 29 aligned with apertures 54 as shown in FIG. 1 to provide a means of flowing the reactant gas through the support plate 27 to reduce the extent of radial (stagnation point) flow adjacent to the substrates 7 and improving coating uniformity thereon. Support plate 27 and the substrate heater 29 assembly are provided with adjustable support rods 30 for varying the distance between substrates 7 and filament network 26, the support rods 30 consisting of threaded posts with lock nuts 60 removably secured thereon.

With the noted reactor apparatus, reactant gas is introduced into the reactor chamber through gas inlet tube 47 and gas feed line 48. Gas feed line 47 is connected to gas dispersion system 25 which introduces the reactant gas into reaction zone 28 of the reactor with substantially uniform axial gas velocity and temperature. Gas dispersion system 25 is supported within the reactor by a pair of adjustable rods 73, suitably connected to reactor cap 42; rods 73 consisting of threaded post with suitable lock nuts 70 removably secured thereon.

Gas dispersion system 25 consists of a thin housing 74 with an apertured bottom surface 75 to introduce and uniformly distribute the reactant gas over filament network 26.

Filament network 26 is also supported in reaction zone 28 by one of the adjustable rods 73. Filament network 26 is provided with lead 76 to which the heating current is conducted from a suitable heat source 77. Filament network 26 extends transversely in reaction zone 28 of the reactor and is oriented such that the maximum cross-sectional area of filament network 26 is perpendicular to the axis of the gas flow in reaction zone 28.

Additional details of the type of reactor system used in the method of the present invention are found in the commonly assigned copending application, Ser. No. 497,159, filed Mar. 20, 1990, now abandoned; the detailed description of which is incorporated herein by reference.

The controls and examples which follow illustrate the method of the invention and of the coated substrate products produced thereby. The examples are for illustrative purposes only and are not meant to limit the scope of the claims in any way.

PRE-CONDITIONING OF A NEW FILAMENT

A new tantalum filament made of 1 mm diameter and 21.6 cm long wire was fabricated and placed in the small scale HFCVD reactor described above. The total surface area of the filament was $\sim 8.5$ cm$^2$. It was carburized in the reactor using a preferred procedure. The procedure involved heating the filament to $\sim 1800°$ C. in the presence of 100 sccm flow of 1% CH$_4$ in H$_2$ at 30 torr. The filament temperature was increased in steps of 50° C. every 30 minutes until a temperature of $\sim 2200°$ C. was reached. This temperature was maintained for 30 minutes. The temperature and flow rate of 1% CH$_4$ in H$_2$ were then reduced to 2100° C. and 20 sccm, respectively, and maintained for another 12 hours. The filament power was then turned off and it was cooled in flowing helium gas. The surface of the filament was carburized well, as evidenced by gold color of TaC. No signs of filament bending were noted during and after carburization. Additionally, no signs of graphitic carbon deposit were seen on the filament.

The filament carburization procedure described above was used prior to using a new filament for depositing PCD films on metallic and ceramic substrates in all the controls and examples described below. In some of these controls and examples a used tantalum filament (filament used previously in depositing PCD films in one or more experiments) was utilized for depositing PCD films. In no case was a virgin tantalum filament used for depositing PCD films.

CONTROLS

A number of control experiments were carried out to deposit PCD films using the HFCVD technique described above in which the deposition parameters were changed to deposit thin as well as thick films.

CONTROL 1

Two 1.35 in. long $\times$ 0.387 in. wide $\times$ 0.062 in. thick molybdenum specimens were placed in the HFCVD reactor described above. The specimens were pre-etched for 3 hours in an ultrasonic bath using a slurry of $\sim 80$ $\mu$m diamond powder in ethanol. They were then heated to $\sim 780°$ C. temperature using a filament made of $\sim 1$ mm diameter tantalum wire, which was pre-carburized, placed $\sim 10$ mm above the specimens and heated to $\sim 2160°$ c. temperature using an AC power supply. The filament temperature was determined by using a dual wavelength pyrometer. The specimen temperature, however, was determined by placing a thermocouple next to its top surface as shown in FIG. 1. A flow of 10 sccm of 1% CH$_4$ in H$_2$ was passed through the reactor for 15 hours to deposit polycrystalline diamond coating on molybdenum specimens, as shown in Table 1. After the deposition time of 15 hours, the flow of feed gas was switched from 10 sccm of 1% CH$_4$ in H$_2$ to 50 standard cubic centimeters per minute (sccm) of He. The filament power was turned off after $\frac{1}{2}$ hour and the coated specimens were cooled under flowing He gas. The molybdenum specimens were deposited with $\sim 7$ $\mu$m thick, adherent and coherent PCD film on the top of ~4 μm thick molybdenum carbide interlayer, which was formed in situ. The rate of PCD deposition in this example was ~0.47 m/hour. The film exhibited excellent electrical resistivity, as shown in Table 1.

Control 1 showed that thin PCD films can be deposited adherently and coherently on metallic substrates using the conventional HFCVD technique.

CONTROL 2

The PCD deposition experiment described in Control 1 was repeated using similar reactor design, type of specimens, and deposition conditions with the exception of using 790° C. specimen temperature, as shown in Table 1. The specimens were pre-etched only for 1 hour in an ultrasonic bath using a slurry of ~80 μm diamond powder in ethanol. The specimens were deposited with ~9 μm thick, adherent and coherent PCD film at the top of ~3 μm thick molybdenum carbide interlayer, as shown in Table 1. The deposition rate was ~0.60 μm/hr. The PCD film exhibited excellent electrical resistivity.

This control indicated that reducing the etching time from 3 hours to 1 hour was not detrimental to the adhesion of PCD film on molybdenum. It also showed that thin PCD films (~9 μm) can be deposited on metallic substrates adherently and coherently using the conventional HFCVD technique.

CONTROL 3

Figure 2:
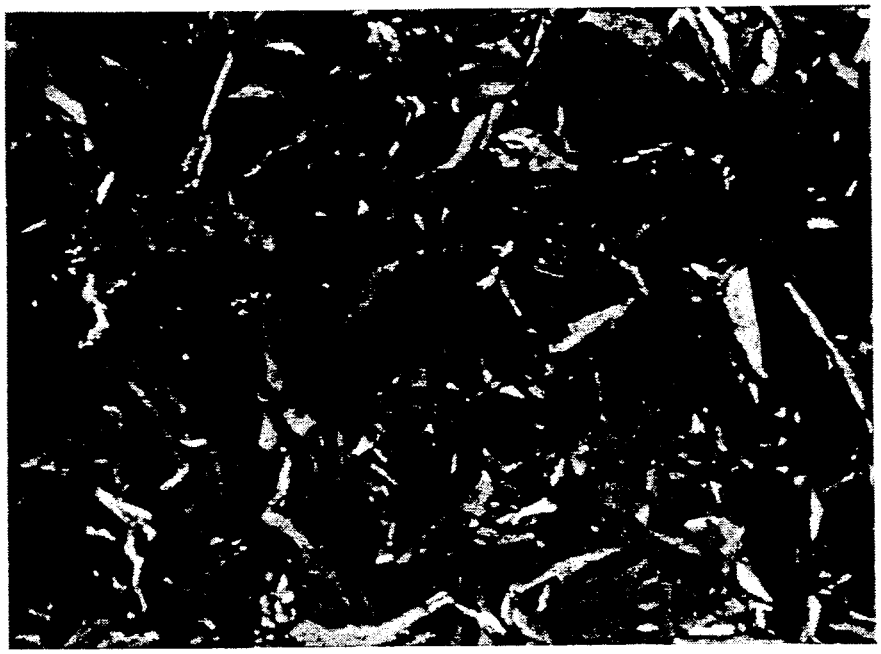
FIGS. 2, 3 and 4 are scanning electron micrographs at 5000 times magnification of compositions comprising PCD films deposited by HFCVD on molybdenum in accordance with the disclosure in copending application, Ser. No. 497,161, filed Mar. 20, 1990.

The PCD deposition experiment described in Control 2 was repeated with the exception of using 22 hrs. of deposition time instead of 15 hours, as shown in Table 1. The specimens were, once again, pre-etched only for 1 hour in an ultrasonic bath using a slurry of ~80 μm diamond powder in ethanol. The specimens were deposited with ~11 μm thick, adherent and coherent PCD film at the top of 3 μm thick molybdenum carbide interlayer (see Table 1). The deposition rate was ~0.50 μm/hour. The PCD film had fairly good surface finish, as shown in FIG. 2.

This control, once again, indicated no detrimental effects of reducing the etching time from 3 hours to 1 hour in depositing a thin PCD film on molybdenum. It also showed that thin PCD films (~11 μm) can be deposited on metallic substrates adherently and coherently using the conventional HFCVD technique.

CONTROL 4

The PCD deposition experiment described in Control 1 was repeated using similar reactor design, type of specimens, and deposition conditions with the exception of using 800° C. specimen temperature, as shown in Table 1. The specimens were pre-etched for 2 hours in an ultrasonic bath using a slurry of ~80 μm diamond powder in ethanol. The specimens were deposited with ~12 μm thick PCD film at the top of ~5 μthick molybden carbide interlayer. The deposition rate in this experiment was ~0.8 μm/hour, which was higher than that noted in Controls 1 to 3. The PCD film on both specimens spalled off completely probably due to build-up of stresses. The film had enhanced crystal orientation in (220), (311) and (400) directions relative to (111) direction, as shown in Table 2.

This control showed that PCD films with thicknesses of ~12 μm or greater can not be deposited adherently and coherently on metallic substrates using the conventional HFCVD technique.

CONTROL 5

Figure 3:

The PCD deposition experiment described in Control 4 was repeated with the exception of using 66 hours of deposition time. One of the specimens was preetched for 3 hours in an ultrasonic bath using a slurry of ~80 μm diamond powder in ethanol. The other specimen, on the other hand, was etched by polishing it with a paste containing ~3 μm diamond particles. The PCD film on each of these specimens was ~45 μm thick, resulting in a deposition rate of ~0.68 μm/hr., which was lower than noted in Control 4 but higher than those of Controls 1 to 3. The PCD film had a decent surface finish, as shown in FIG. 3. However, the PCD film on these specimens spalled-off completely, probably due to build-up of stresses by high deposition rate. The film showed enhanced crystal orientation in (220) and (400) directions relative to (111) direction as shown in Table 2.

This control, once again, showed that PCD films with thicknesses ≧12 μm can be deposited adherently and coherently on metallic substrates using the conventional HFCVD technique.

CONTROLS 6A and B

One 1.35 in. long×0.387 in. wide×0.062 in. thick molybdenum specimen (Control 6A) and one 1.35 in. long×0.387 in. wide silicon piece (Control 6B) were placed in a reactor described in Control 1. These specimens were pre-etched for 4 hours in an ultrasonic bath using a slurry of ~80 μm diamond powder in ethanol. The specimens were heated to ~790° C. temperature using a filament made of ~1 mm diameter tantalum wire, which was placed ~10 mm above the specimens and heated to ~2170° C. temperature using an AC power supply. The filament was pre-carburized using the procedure described earlier. The filament and specimen temperatures were determined using the techniques described in Control 1. A flow of 10 sccm of 1% $CH_4$ in $H_2$ was passed through the reactor for 18 hours to deposit PCD film on molybdenum and silicon specimens, as set forth in Table 1. After the deposition time, the flow of feed gas was switched from 10 sccm of 1% $CH_4$ in $H_2$ to ~50 sccm of He. The filament power was turned off after ½ hour and the coated specimens were cooled under flowing He gas. The molybdenum specimen was deposited with ~7 μm thick, adherent and coherent PCD film at the top of ~3 μm thick carbide interlayer, which was formed in situ. The deposition rate was ~0.39 μm/hr., which was slightly lower than that noted in Controls 1-5. The silicon specimen was also deposited with ~7 μm thick adherent and coherent PCD film at the top of ~1 μm thick carbide interlayer. The coated silicon specimen was, however, bent a little due to build-up of stresses in the film during coating and upon cooling.

Controls 6A and B showed that thin PCD films (<12 μm) can be deposited adherently and coherently on metallic and ceramic substrates using the conventional HFCVD technique.

CONTROLS 7A and B

Figure 4:
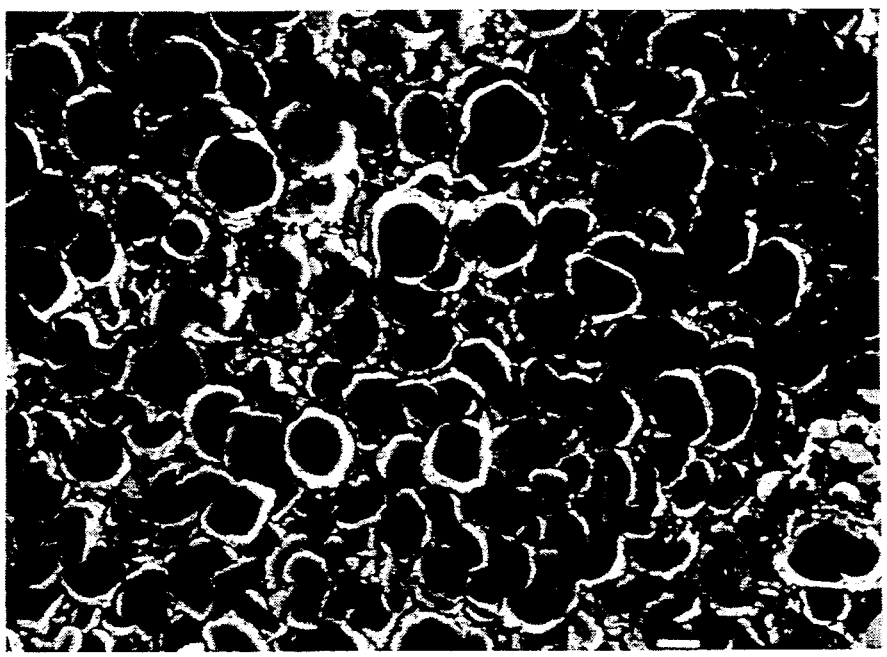
Figure 5:
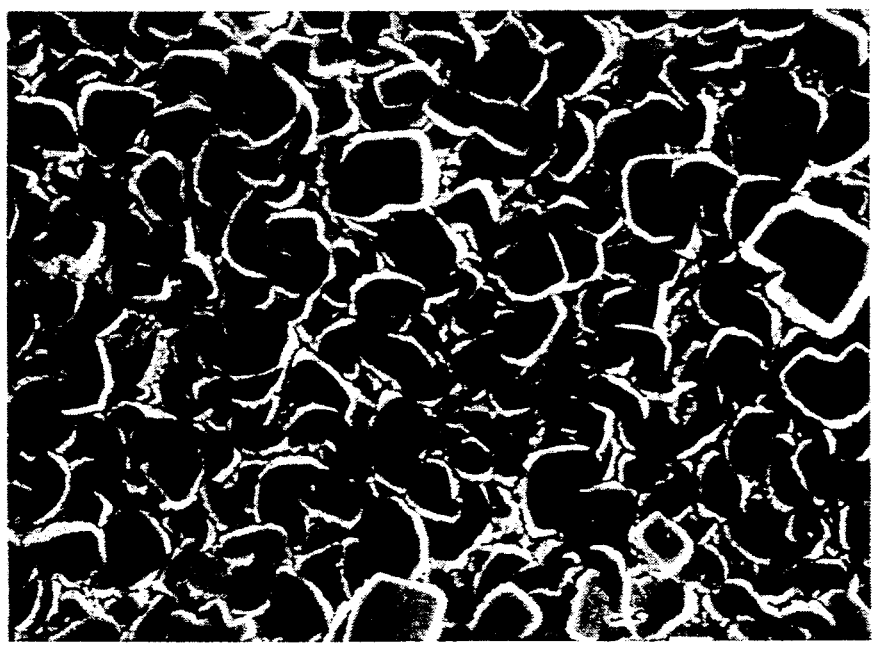
FIG. 5 is a scanning electron micrograph at 5000 times magnification of compositions comprising PCD film deposited by HFCVD on silicon in accordance with the disclosure in the co-pending application, U.S. Ser. No. 497,161, filed Mar. 20, 1990.

The PCD deposition experiment described in Controls 6A and B were repeated using similar reactor design, type of specimens, and deposition conditions except for using 780° C. specimen temperature and 16 hours deposition time. The specimens were pre-etched for 2 hours in an ultrasonic bath using a slurry of ~80

μm diamond powder in ethanol. The molybdenum specimen (Control 7A) was deposited with ~7 μm thick adherent and coherent PCD film at the top of ~3 μm thick carbide interlayer as set forth in Table 1. The silicon specimen (Control 7B) was also deposited with ~7 μm thick adherent and coherent PCD film at the top of ~1 μm thick carbide interlayer. The deposition rate both on molybdenum and silicon was ~0.44 μm/hr. The coated silicon specimen was, once again, bent a little due to build-up of stresses in the film during coating and upon cooling. The PCD films on molybdenum and silicon specimens had decent surface finish, as shown in FIGS. 4 and 5. The film had enhanced crystal orientation in (220) and (400) directions relative to (111) direction, as shown in Table 2.

Controls 7A and B showed that thin PCD films (<12 μm) with good surface finish can be deposited adherently and coherently on metallic and ceramic substrates using the conventional HFCVD technique.

CONTROLS 8A and B

The PCD deposition experiment described in Controls 7A and B were repeated except for using 60 hours deposition time. The specimens were pre-etched for 3 hours in an ultrasonic bath using a slurry of ~80 μm diamond powder in ethanol. The thickness of PCD film on molybdenum and silicon specimens was ~32 μm, resulting in deposition rates of ~0.53 μm/hr. for each of Controls 8A and B as summarized in Table I, which was very similar to that noted in Controls 1 to 3. The film on molybdenum spalled-off completely. The film spallation could be related to build-up of stresses due to high deposition rate or deposition of thick coating. The film adhered well to silicon, but the coated specimen was bent considerably due to build-up of stresses during coating and upon cooling. In fact, the coated silicon specimen disintegrated into pieces while removing from the reactor.

Control 8A and B showed that thick PCD films, i.e., greater than 11 μm, can not be deposited adherently and coherently on metallic and ceramics substrates using the conventional HFCVD technique.

CONTROL 9

Two 1.35 in. long×0.387 in. wide×0.062 in. thick molybdenum specimens were placed in a reactor shown in FIG. 1. The specimens were pre-etched for 1 hour in an ultrasonic bath using a slurry of ~80 μm diamond powder in ethanol. The specimens were heated to ~740° C. temperature using a filament made of ~1.5 mm diameter tantalum wire placed ~10 mm above the specimens. The filament was heated to ~1980° C. temperature using an AC power supply. The filament was pre-carburized using the procedure described earlier. The filament and specimen temperatures were determined using the techniques described in Control 1. A flow of 10 sccm of 1% CH$_4$ in H$_2$ was passed through the reactor for 20 hours to deposit PCD film on molybdenum specimens, as shown in Table 1. After the deposition time, the flow of feed was switched from 10 sccm of 1% CH$_4$ in H$_2$ to ~50 sccm of He. The filament power was turned off after ½ hour and the coated specimens were cooled under flowing He gas. The molybdenum specimens were deposited with ~4 μm thick, adherent and coherent PCD film at the top of ~2 μm thick carbide interlayer. The deposition rate was ~0 2 μm/hr., which was considerably lower than noted in Controls 1 to 8. The PCD film had excellent electrical resistivity, as shown in Table 1.

This control again showed that thin PCD films exhibiting excellent electrical resistivity can be deposited adherently and coherently on metallic substrates using the conventional HFCVD technique.

CONTROL 10

The PCD deposition experiment described in Control 9 was repeated using similar reactor design, pre-etching technique, and deposition conditions except for using silicon pieces and 750° C. specimen temperature. The silicon specimens were deposited with ~4 μm thick adherent and coherent PCD film at the top of ~1 μm thick carbide interlayer, which was formed in situ. The deposition rate was ~0.20 μm/hr. The PCD film had excellent electrical resistivity, as shown in Table 1. The coated specimens were however bent slightly due to build-up of stresses during coating and cooling. The film had enhanced crystal orientation in (311) and (400) directions relative to (111) direction, as shown in Table 2.

This control again showed that thin PCD films with excellent electrical resistivity can be deposited on ceramic substrates adherently and coherently using the conventional HFCVD technique.

CONTROL 11

Two 1.35 in. long×0.387 in. wide×0.062 in. thick molybdenum specimens were placed in the same reactor used in the foregoing controls. The specimens were pre-etched for 3 hours in an ultrasonic bath using a slurry of ~80 μm diamond powder in ethanol. The specimens were heated to ~800° C. temperature using a filament made of ~1.25 mm diameter tantalum wire placed ~10 mm above the specimens. The filament was heated to ~2180° C. temperature using an AC power supply. The filament was pre-carburized using the procedure described earlier. The filament and specimen temperatures were determined using the techniques described in Control 1. A flow of 10 sccm of 1% CH$_4$ in H$_2$ was passed through the reactor for 20 hours to deposit PCD film on molybdenum specimens (see Table 1). After the deposition time, the flow of feed gas was switched from 10 sccm of 1% CH$_4$ in H$_2$ to ~50 sccm of He. The filament power was turned off after ½ hour and the coated specimens were cooled under flowing He gas. The molybdenum specimens were deposited with ~6 μm thick, adherent and coherent PCD film at the top of ~2 ~m thick carbide interlayer, which was formed in situ. The deposition rate was ~0.3 μm/hr. The film showed good electrical resistivity, as shown in Table 1.

This control again showed that thin PCD films can be deposited adherently and coherently on metallic substrates using the conventional HFCVD technique.

CONTROL 12

The PCD deposition experiment described in Control 11 was repeated using similar reactor design, type of specimens, pre-etching technique, and deposition conditions except for using 5 sccm of 1% CH$_4$ in H$_2$ (see Table 1). The specimens were deposited with ~4 μm thick, adherent and coherent PCD film at the top of ~2 μm thick carbide interlayer. The deposition rate was ~0.2 μm/hr. The film showed good electrical resistivity, as documented in Table 1.

This control showed that thin PCD films can be deposited adherently and coherently on metallic substrates using low flow rate of a mixture of 1% $CH_4$ in $H_2$.

CONTROL 13

The PCD deposition experiment described in Control 11 was repeated again using similar reactor design, type of specimens, pre-etching technique, and deposition conditions except for using 15 sccm of 1% $CH_4$ in $H_2$ (see Table 1). The specimens were deposited with ~7 $\mu$m thick, adherent and coherent PCD film with good electrical resistivity, as shown in Table 1. The deposition rate was ~0.35 $\mu$m/hr.

This control again showed that thin PCD films can be deposited adherently and coherently on metallic substrates using slightly higher flow rate of 1% $CH_4$ in $H_2$.

CONTROL 14

The PCD deposition experiment described in Control 11 was repeated using similar reactor design, type of specimens, pre-etching technique, and deposition conditions except for using 20 sccm of 1% $CH_4$ in $H_2$ (see Table 1). The specimens were deposited with ~5 $\mu$m thick, adherent and coherent PCD film with good electrical resistivity, as shown in Table 1.

This control showed that thin PCD films can be deposited adherently and coherently on metallic substrates using higher flow rate of 1% methane in $H_2$.

Controls 1 to 14 showed that thin (<11 $\mu$m) PCD films can be deposited adherently and coherently on metallic and ceramic substrates using conventional HFCVD techniques. They also showed that the deposition of adherent and coherent thick ($\geq$12 $\mu$m) PCD films can not be achieved by the conventional HFCVD technique. It is believed that the failure of depositing thick PCD films by the conventional HFCVD techniques is related to build-up of stresses, resulting in film delamination.

EXAMPLES

Examples 1 to 7 set forth below illustrate the method of the present invention for depositing thin as well as thick PCD films with good surface finish.

EXAMPLE 1

Two 1.35 in. long × 0.387 in. wide × 0.062 in. (or 0.015 in.) thick molybdenum specimens were placed in a reactor described in Control 1. The specimens were pre-etched for 3 hours in an ultrasonic bath using a slurry of ~80 $\mu$m diamond powder in ethanol. The specimens were deposited with PCD film using a novel cyclic process. The process involved depositing PCD film in one set consisting of two different cycles. For example, the specimens were heated to 800° C. temperature and deposited with PCD for 10 hours using 10 sccm of $CH_4$ in $H_2$ using a tantalum filament made of ~1.25 mm diameter wire, placed ~10 mm above the specimens (see Table 3 for details of deposition parameters). The filament was pre-carburized using the procedure described earlier. After 10 hours PCD deposition in the first cycle, the temperature was reduced to 725° C. in about 10 minutes and maintained there to deposit PCD for 10 more hours, thereby providing a total of 20 hours deposition time. This experiment therefore involved 1 set of two deposition cycles of 10 hours each carried out at 800° C. and 725° C., respectively. After the deposition time 20 hours, the flow of feed gas was switched from 10 sccm of 1% $CH_4$ in $H_2$ to 50 sccm of He. The filament power was turned off after $\frac{1}{2}$ hour and the specimens were cooled in flowing He gas.

Figure 6:
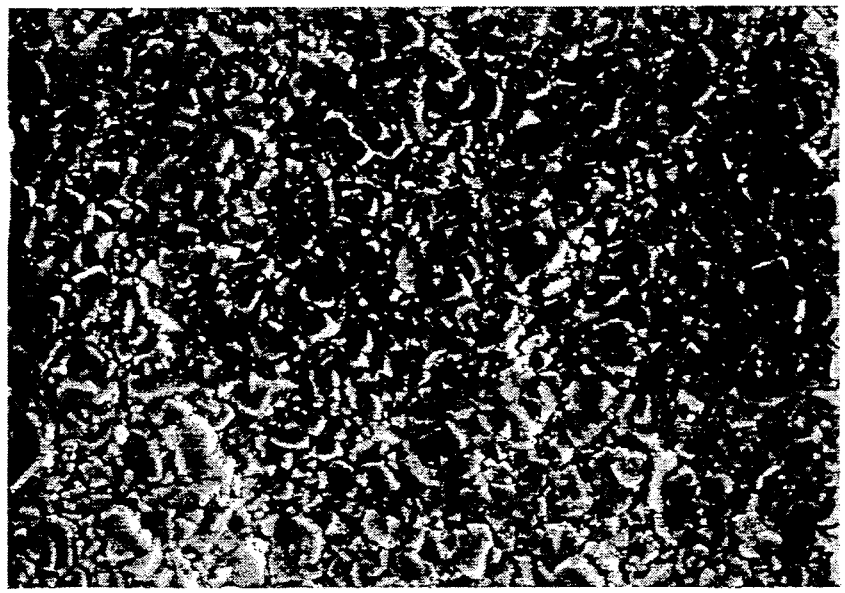
FIGS. 6, 7, 8 and 9 are scaning electron micrographs at 5000 times magnification of compositions comprising a plurality of PCD films deposited by HFCVD on molybdenum in accordance with the present invention.

The specimens were deposited with ~6 $\mu$m thick, adherent and coherent PCD film with good electrical resistivity, as shown in Table 3. The film had enhanced crystal orientation in (220), (311) and (400) directions relative to (111) direction, as shown in Table 4. The PCD film deposited by the cyclic process had a good surface finish, as shown in FIG. 6. This example therefore showed that presently claimed cyclic process is capable of depositing thin PCD films adherently and coherently on metallic substrates with good surface finish.

EXAMPLE 2

The cyclic deposition experiment described in Example 1 was repeated using similar reactor design, type of specimens, pre-etching technique, and deposition conditions except for employing lower temperature 725° C. for 10 hours in the first cycle and higher temperature 800° C. for 10 hours in the second cycle (see Table 3). The total deposition time in this one set of cyclic experiment was 20 hours.

Figure 7:
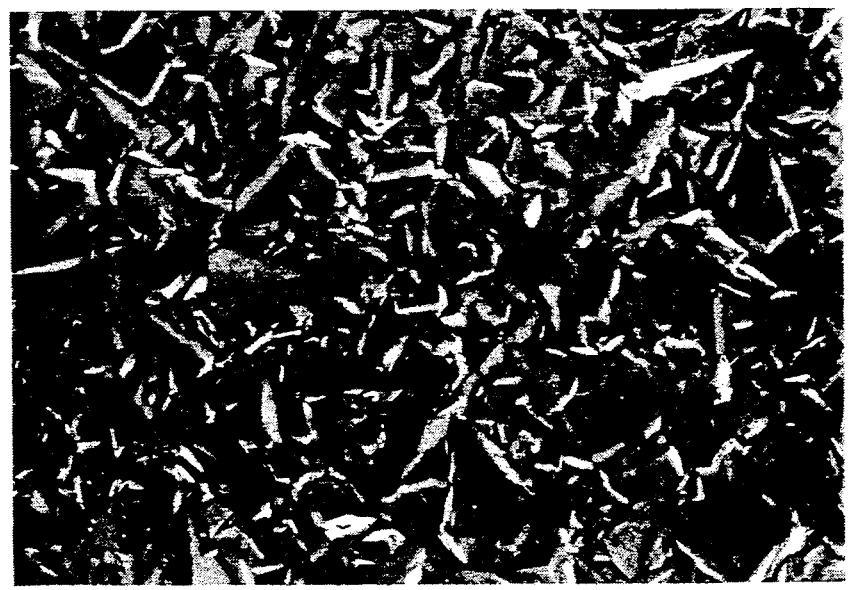

The specimens were deposited with ~5 $\mu$m thick, adherent and coherent PCD film with good resistivity, as shown in Table 3. The film had a decent surface finish, as shown in FIG. 7. This example also showed that thin PCD films can be deposited adherently and coherently on metallic substrates by the present process which is not dependent on whether the temperature during the first deposition cycle is at least 25° C. higher or lower than the temperature during the second cycle.

EXAMPLE 3

The cyclic deposition experiment described in Example 1 was repeated using similar reactor design, type of specimens, pre-etching technique, and deposition conditions except for employing two sets of two deposition cycles conducted at 800° C. and 725° C. for 10 hours each for a total deposition time of 40 hours (see Table 3).

The specimens were deposited with ~11 $\mu$m thick, adherent and coherent PCD film with excellent resistivity, as shown in Table 3. The film had enhanced crystal orientation in (220) and (400) directions relative to (111) direction, as shown in Table 4. This example showed that the thickness of the adherent and coherent PCD coating on the substrates increases as a function of the number of deposition cycles.

EXAMPLE 4

The cyclic deposition experiment described in Example 2 was repeated using similar reactor design, type of specimens, pre-etching technique, and deposition conditions except for employing two sets of two deposition cycles conducted at 725° and 800° C. for 10 hours each for a total deposition time of 40 hours (see Table 3).

Figure 8:
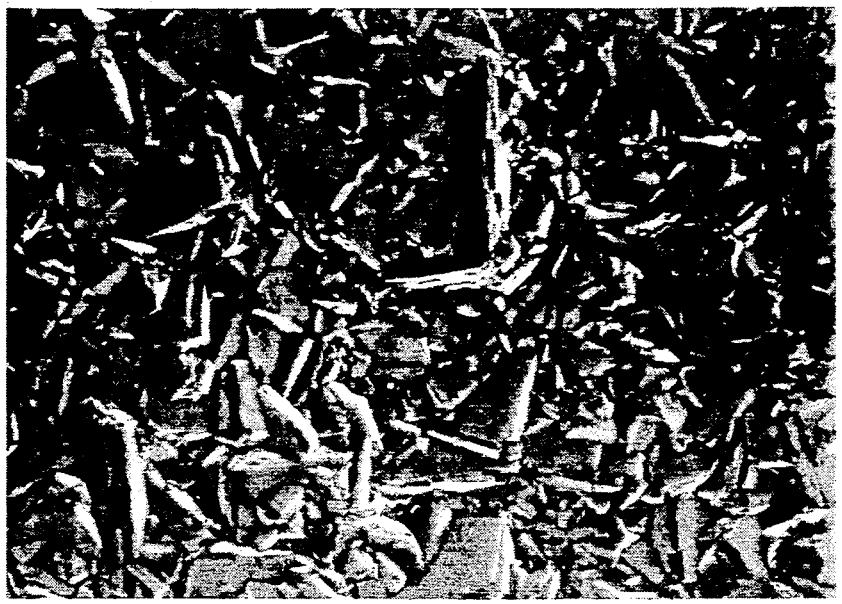

The specimens were deposited with ~12 $\mu$m thick, adherent and coherent PCD film with excellent resistivity, as shown in Table 3. The film had a good surface finish, as shown in FIG. 8. This example confirmed the ability of the present method to deposit a thick adherent and coherent PCD coating on metallic substrates by using a novel cyclic process.

EXAMPLE 5

The cyclic deposition experiment described in Example 1 was repeated using similar reactor design, type of specimens, pre-etching technique, and deposition conditions except for employing four sets of two deposition cycles conducted at 800° and 725° C. temperatures (see Table 3). The cycles in the first three sets were carried out for 10 hours each; whereas, the fourth set of cycles were done for 5 hours each. These four sets of cycles provided a total deposition time of 70 hours.

The specimens were deposited with ~17 μm thick, adherent and coherent PCD film with good electrical resistivity, as shown in Table 3.

EXAMPLE 6

The cyclic deposition experiment described in Example 1 was repeated using similar reactor design, type of specimens, pre-etching technique, and deposition conditions except for employing five sets of two deposition cycles conducted at 800° and 725° C. temperatures. The cycles in the first four sets were carried out for 10 hours each; whereas, the fifth set of cycles were done for 5 hours each. These five sets of cycles provided a total deposition time of 90 hours (se Table 3).

Figure 9:
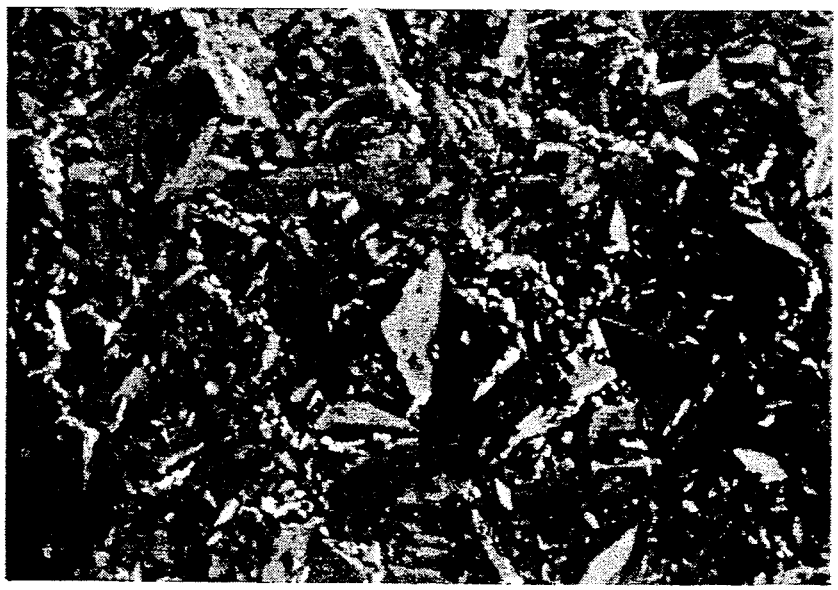
Figure 10:
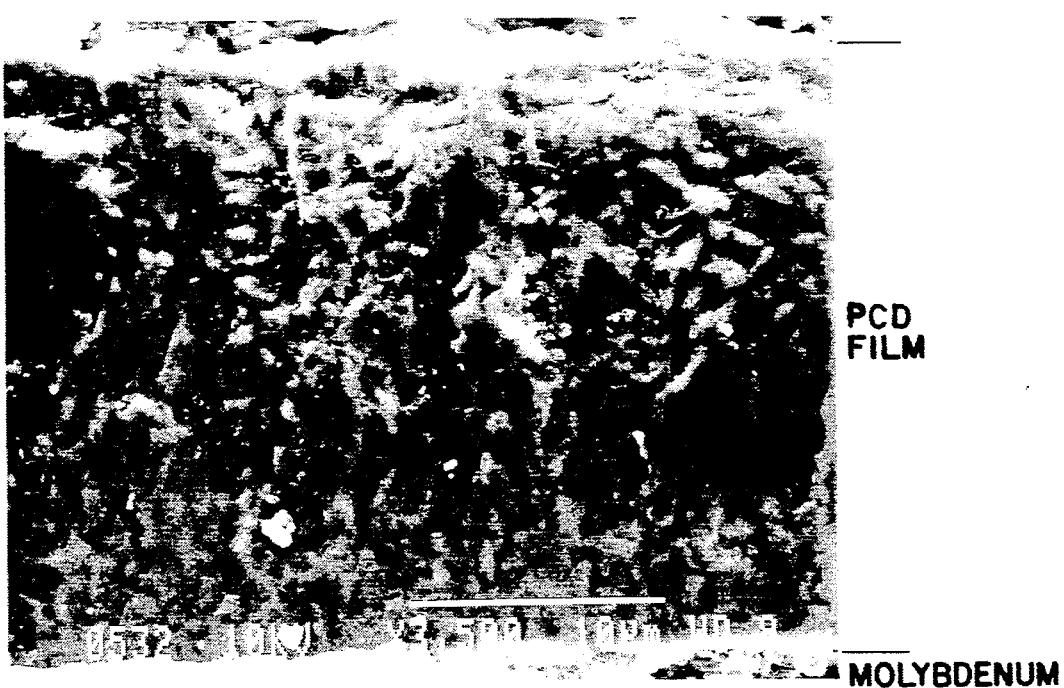
FIGS. 10 and 11 are scanning electron micrographs at 3500 and 5000 times magnification respectively, of compositions comprising a plurality of PCD films in cross-section deposited by HFCVD on molybdenum in accordance with the present invention.
Figure 11:

The specimens were deposited with ~25 μm thick, adherent and coherent PCD film, as shown in Table 3. The film had enhanced crystal orientation in (220), (311) and (400) directions relative to (111) direction, as shown in Table 4. The film had a decent surface finish, as shown in FIG. 9. Cross-sectional micrographs of the film presented in FIGS. 10 and 11 showed disruption in columnar growth pattern of diamond film, resulting in good surface finish.

EXAMPLE 7

The cyclic deposition experiment described in Example 1 was repeated using similar reactor design, type of specimens, pre-etching technique, and deposition conditions except for employing six sets of two deposition cycles conducted at 800° C. and 725° C. temperatures each for 10 hours. These six sets of cycles provided a total deposition time of 120 hours (see Table 3).

The specimens were deposited with ~34 μm thick adherent and coherent PCD film, as shown in Table 3. This example therefore showed that a novel cycling process could be used to deposit thick (~34 μm) PCD films adherently and coherently on metallic substrates.

CONCLUSIONS

The foregoing examples illustrate that both thin and thick PCD films can be deposited adherently and coherently on metallic and ceramic substrates only by cycling the deposition parameters in the HFCVD technique. They also showed that PCD films with enhanced crystal orientation in (220), or (311) and (400) directions relative to (111) direction, good electrical resistivity, and surface finish can be produced by using the novel cyclic technique.

Without the departing from the spirit and scope of this invention, one of ordinary skill can make various changes and modification to the invention to adapt it to various usages and conditions. As such, these changes and modifications are properly, equitably, and intended to be, within the full range of equivalence of the following claims.

TABLE 1

| Control | 1[a] | 2[a] | 3[a] | 4[a] | 5[a] | 6A[a] | 6B[a] | 7A[a] | 7B[a] |
|---|---|---|---|---|---|---|---|---|---|
| Experiment No. | 49-1 | 47-1 | 55-1 | 46-1 | 41-1 | 44-1 | 44-1 | 45-1 | 45-1 |
| Substrate | Mo | Mo | Mo | Mo | Mo | Mo | Si | Mo | Si |
| Substrate Temp., °C. | 780 | 790 | 790 | 800 | 800 | 790 | 790 | 780 | 780 |
| Filament Temp., °C. | 2160 | 2180 | 2180 | 2210 | 2190 | 2170 | 2170 | 2160 | 2160 |
| Flow Rate of 1% $CH_4$ in $H_2$, sccm | 10 | 10 | 10 | 10 | 10 | 10 | 10 | 10 | 10 |
| Total Pressure, Torr | 30 | 30 | 30 | 30 | 30 | 30 | 30 | 30 | 30 |
| Deposition Time, Hrs. | 15 | 15 | 22 | 15 | 66 | 18 | 18 | 16 | 16 |
| Thickness, μm | | | | | | | | | |
| Molybdenum Carbide | ~4 | ~3 | ~3 | ~5 | N.D. | ~3 | ~1 | ~3 | ~1 |
| Diamond | ~7 | ~9 | ~11 | ~12 | ~45 | ~7 | ~4 | ~7 | ~7 |
| Deposition Rate, μm/hr | 0.47 | 60 | 0.50 | 0.80 | 0.68 | 0.39 | 0.39 | 0.44 | 0.44 |
| Resistivity, Ohm-cm | $1.1 \times 10^{12}$ | $3.2 \times 10^{11}$ | N.D. | N.D. | N.D. | N.D. | N.D. | N.D. | N.D. |
| Observations | * | * | * | ** | ** | * | * | * | * |

| Control | 8A[a] | 8B[a] | 9[b] | 10[b] | 11[c] | 12[c] | 13[c] | 14[c] |
|---|---|---|---|---|---|---|---|---|
| Experiment No. | 53-1 | 53-1 | 61-1 | 71-1 | 5-3 | 6-3 | 7-3 | 8-3 |
| Substrates | Mo | Si | Mo | Si | Mo | Mo | Mo | Mo |
| Substrate Temp., °C. | 790 | 790 | 740 | 750 | 800 | 800 | 800 | 800 |
| Filament Temp., °C. | 2170 | 2170 | 1980 | 1980 | 2180 | 2160 | 2170 | 2180 |
| Flow Rate of 1% $CH_4$ in $H_2$, sccm | 10 | 10 | 10 | 10 | 10 | 5 | 15 | 20 |
| Total Pressure, Torr | 30 | 30 | 30 | 30 | 30 | 30 | 30 | 30 |
| Deposition Time, Hrs. | 60 | 60 | 20 | 20 | 20 | 20 | 20 | 20 |
| Thickness, μm | | | | | | | | |
| Molybdenum Carbide | N.D. | N.D. | ~2 | ~1 | ~2 | ~2 | ~2 | ~2 |
| Diamond | ~32 | ~32 | ~4 | ~4 | ~6 | ~4 | ~7 | ~5 |
| Deposition Rate, μm/hr | 0.53 | 0.53 | 0.20 | 0.20 | 0.30 | 0.20 | 0.35 | 0.25 |
| Resistivity, | N.D. | N.D. | $4.8 \times 10^{10}$ | $3.2 \times 10^{10}$ | $1.3 \times 10^{10}$ | $2.1 \times 10^9$ | $1.1 \times 10^8$ | $3.1 \times 10^8$ |

TABLE 1-continued

Ohm-cm
Observations    *    **    *    *    *    *    *    *

[a] The diameter of tantalum wire used for making filament in these experiments was ~1 mm.
[b] The diameter of tantalum wire used for making filament in these experiments was ~1.5 mm.
[c] The diameter of tantalum wire used for making filament in these experiments was ~1.25 mm.
*Adherent and coherent film.
**Film spalled completely
N.D. - Not determined

TABLE 2

Crystal Orientation and Average Size of PCD Films

| | INDUSTRIAL GRADE DIAMOND POWDER[2] | CONTROLS | | | |
|---|---|---|---|---|---|
| | | 4 | 5 | 7A | 10 |
| Experiment No. | | 46-1 | 41-1 | 45-1 | 71-1 |
| Intensity of (hkl) reflection relative to (111)[1] % | | | | | |
| (220)[3] | 25 | 135 | 57 | 130 | 22 |
| (311) | 16 | 19 | 9 | 14 | 26 |
| (400)[4] | 8 | 24 | 13 | 22 | 13 |

[1] The relative intensity of crystals in (111) direction is normalized to 100.
[2] PDF 6-675
[3] (220) Crystal orientation is parallel to (110) orientation, and therefore crystals are in the same family of planes.
[4] (400) Crystal orientation is parallel to (100) orientation, and therefore crystals are in the same family of planes.

TABLE 3

| Example | 1 | 2 | 3 | 4 | 5 | 6 | 7 |
|---|---|---|---|---|---|---|---|
| Experiment No. | 12-3 | 13-3 | 15-3 | 16-3 | 14-3 | 32-3 | 37-3 |
| Specimens | Mo | Mo | Mo | Mo | Mo | Mo | Mo |
| Specimen Temp., °C. | | | | | | | |
| First Cycle | 800 | 725 | 800 | 725 | 800 | 800 | 800 |
| Second Cycle | 725 | 800 | 725 | 800 | 725 | 725 | 725 |
| No. of Sets of Cycles | 1 | 1 | 2 | 2 | 4 | 5 | 6 |
| Flow Rate of 1% $CH_4$ in $H_2$, sccm | 10 | 10 | 10 | 10 | 10 | 10 | 10 |
| Total Pressure, Torr | 30 | 30 | 30 | 30 | 30 | 30 | 30 |
| Total Deposition Time, Hrs. | 20 | 20 | 40 | 40 | 70 | 90 | 120 |
| Thicknesses, μm | | | | | | | |
| Carbide Interlayer | 3 | 2 | 3 | 3 | 5 | 5 | 6 |
| Diamond | 6 | ~5 | 11 | 12 | 17 | 25 | 34 |
| Resistivity, Ohm-cm | $1.3 \times 10^{12}$ | $5.1 \times 10^{10}$ | $>1.0 \times 10^{14}$ | $>1.0 \times 10^{14}$ | $5.3 \times 10^{10}$ | N.D. | N.D. |
| Observations | * | * | * | * | * | * | * |

Note: The diameter of tantalum wire used for making filament in these experiments was ~1.25 mm.
*Adherent and coherent film.
N.D. - Not determined

TABLE 4

CRYSTAL ORIENTATION AND AVERAGE CRYSTALLITE SIZE OF PCD FILMS

| | Industrial Grade Diamond Powder[2] | EXAMPLES | | |
|---|---|---|---|---|
| | | 1 | 3 | 6 |
| Intensity of (hkl) reflection relative to (111)[1] % | | | | |
| (220)[3] | 25 | 145 | 48 | 70 |
| (311) | 16 | 23 | 15 | 19 |
| (400)[4] | 8 | 32 | 13 | 14 |
| Average crystaline Size, Å | — | 780 | 1,400 | 1,500 |

[1] The relative intensity of crystals in (111) direction is normalized to 100.
[2] PDF 6-675
[3] (220) Crystal orientation is parallel to (110) orientation, and therefore are in the same family of planes.
[4] (400) Crystal orientation is parallel to (100) orientation, and therefore are in the same family of planes.

What is claimed is:

1. A chemical vapor deposition method for fabricating a coated substrate product comprising:
   placing a parent substrate comprising a material selected from the group consisting of a single crystal, polycrystalline materials, metal, metal alloy, mixture of metals, ceramic materials and mixtures thereof into a hot filament chemical vapor deposition reactor;
   chemical vapor depositing at least four separate polycrystalline diamond layers onto said parent substrate in the presence of a hot filament during at least two sets of two cycles in which at least 25° C. deposition temperature difference exists between each of the cycles, with the length of time of each cycle being at least three hours; and
   recovering a substrate coated with a thickness of said polycrystalline diamond layers of at least 12 μm and exhibiting uniform microstructure and a high electrical resistivity.

2. The method of claim 1 wherein at least a 10 Torr deposition pressure difference exists between cycles.

3. The method of claim 1 wherein the total thickness of said polycrystalline diamond layers is in the range of about 12 μm to about 250 μm.

4. The method of claim 1 wherein the total thickness of said polycrystalline diamond layers is in the range of about 20 μm to about 130 μm.

5. The method of claim 1 wherein said separate polycrystalline diamond layers are each chemical vapor deposited at deposition temperatures in the range of 650° to 825° C.

6. The method of claim 1 wherein said separate polycrystalline diamond layers are each chemical vapor deposited at deposition pressures in the range of 20 to 100 Torr.

7. The method of claim 1 wherein said polycrystalline diamond layers have electrical resistivity greater than $10^6$ ohm-cm.

8. The method of claim 1 wherein said parent substrate is molybdenum.

9. The method of claim 8 where molybdenum carbide is formed in situ between said parent substrate and said first polycrystalline diamond layer.

10. The method of claim 1 wherein said parent substrate is silicon.

11. The method of claim 10 wherein silicon carbide is formed in situ between said parent substrate and said first polycrystalline diamond layer.

12. The method of claim 1 wherein said polycrystalline diamond layer has at least partially ordered crystal orientation in at least two planes in comparison to industrial grade diamond crystals.

13. The method of claim 12 wherein said polycrystalline diamond layer has an enhanced crystal orientation in the (220) and (400) directions relative to the (111) direction.

14. The method of claim 13 wherein said polycrystalline diamond layer includes an enhanced crystal orientation in the (311) direction relative to the (111) direction.

15. The method of claim 12 wherein said polycrystalline diamond layer has an enhanced crystal orientation in the (311) and (400) directions relative to the (111) direction.

16. A chemical vapor deposition method for fabricating a coated substrate product comprising the following sequential steps:
(1) placing a parent substrate comprising a material selected from the group consisting of a single crystal, polycrystalline materials, metal, metal alloy, mixture of metals, ceramic materials and mixtures thereof into a hot filament chemical vapor deposition reactor;
(2) heating said parent substrate during a first cycle of at least two sets of two cycles to a deposition temperature in the range of about 650° to 825° C. by means of a filament electrically charged to a temperature in the range of about 1800° to 2250° C.;
(3) chemically vapor depositing during the first cycle of the first set a first polycrystalline diamond layer having a thickness in the range of about 2 to about 10 μm onto the heated substrate by passing a gaseous mixture of hydrocarbons and hydrogen into said reactor for a period of at least three hours;
(4) continue heating said coated substrate during a second cycle of the first set by the same means such that a deposition temperature difference of at least 25° C. exists between the first and second cycles of the first set;
(5) chemically vapor depositing during the second cycle of the first set a second polycrystalline diamond layer having a thickness in the range of about 2 to about 10 μm onto said first layer for a period of at least an additional three hours;
(6) chemically vapor depositing during the first cycle of at least the second set a third polycrystalline diamond layer having a thickness in the range of about 2 to about 10 μm onto the heated substrate by the same means as in step (3);
(7) continue heating said coated substrate during a second cycle of the second set by the same means as step (4) such that a deposition temperature difference of at least 25° C. exists between the first and second cycles of the second set;
(8) chemically vapor depositing during the second cycle of the second set at least a fourth polycrystalline diamond layer having a thickness in the range of about 2 to about 10 μm onto said third layer for a period of at least an additional three hours;
(9) passing an inert gas over said coated substrate while said filament remains electrically charged for a period of time to purge said reactor of said gaseous mixture;
(10) cooling sad coated substrate by removing the charge from said filament and continuing the passing of the inert gas over the substrate; and
(11) recovering a substrate coated with at least four polycrystalline diamond layers having a total thickness of said polycrystalline diamond layers in the range of about 12 μm to about 250 μm and exhibiting uniform microstructure and a high electrical resistivity.

17. The method of claim 16 wherein the deposition temperature difference between each cycle per set is at least 50° C.

18. The method of claim 16 wherein the total thickness of said polycrystalline diamond layer is about 20 μm to about 130 μm.

19. The method of claim 16 wherein said polycrystalline diamond layers have electrical resistivity greater than $10^6$ ohm-cm.

20. The method of claim 16 wherein said parent substrate is molybdenum.

21. The method of claim 20 wherein 2 μm to 5 μm of molybdenum carbide is formed in situ between said parent substrate and said first polycrystalline diamond layer.

22. The method of claim 16 wherein said parent substrate is silicon.

23. The method of claim 22 wherein up to 2 μm of silicon carbide is formed in situ between said parent substrate and said first polycrystalline diamond layer.

24. The method of claim 16 wherein said polycrystalline diamond layer has at least partially ordered crystals.

25. The method of claim 16 wherein said polycrystallien diamond layer has an enhanced crystal orientation in the (220) and (400) directions relative to the (111) direction.

26. The method of claim 25 wherein said polycrystalline diamond layer includes an enhanced crystal orientation in the (300) direction relative to the (111) direction.

27. The method of claim 24 wherein said polycrystalline diamond layer has an enhanced crystal orientation in the (311) and (400) directions relative to the (111) direction.

28. A chemical vapor deposition method for fabricating a coated substrate producing comprising:
placing a parent substrate comprising a material selected from the group consisting of a single crystal, polycrystalline materials, metal, metal alloy, mixture of metals, ceramic materials and mixtures thereof into a hot filament chemical vapor deposition reactor;
chemical vapor depositing at least four separate polycrystalline diamond layers onto said parent substrate in the presence of a hot filament during at least two sets of two cycles in which the temperature is maintained constant and at least 10 Torr pressure difference exists between each of the cycles, with the length of time of each cycle being at least three hours; and
recovering a substrate coated with a thickness of said polycrystalline diamond layers of at least about 12 μm and exhibiting uniform microstructure and a high electrical resistivity.

* * * * *

UNITED STATES PATENT AND TRADEMARK OFFICE
CERTIFICATE OF CORRECTION

PATENT NO. : 5,147,687

DATED : September 15, 1992

INVENTOR(S) : Garg, et al.

It is certified that error appears in the above-identified patent and that said Letters Patent is hereby corrected as shown below:

Column 1, line 29, "metal" should be —metallic—.

Column 1, line 45, after "both" insert —on molybdenum—.

Column 5, line 49, "c." should be —C.—.

Column 9, line 3, " ~0.47m/hour" should be ——0.47 $\mu$m/hour—.

Column 9, line 57, "$\mu$ thick" should be —$\mu$m thick—.

Column 10, line 21, "can" should be —cannot—.

Column 11, line 61, after "feed" insert —gas—.

Column 11, line 67, " ~02" should be ——0.2— .

Column 12, line 51, " ~2~m" should be ——2$\mu$m—.

Column 18, line 59, "chemical" should be —chemically—.

Column 18, line 59, "chemical" should be —chemically—.

Column 19, line 3, "where" should be —wherein—.

Column 20, line 7, "sad" should be —said—.

Column 20, line 43, "300" should be —311—.

Column 20, line 50, "producing" should be —product—.

Column 4, line 60, "an" should be —as—.

Column 15, line 25, "(se Table 3)" should be —(see Table 3)—.

UNITED STATES PATENT AND TRADEMARK OFFICE
CERTIFICATE OF CORRECTION

PATENT NO. : 5,147,687
DATED : September 15, 1992
INVENTOR(S) : Garg, et al.

It is certified that error appears in the above-indentified patent and that said Letters Patent is hereby corrected as shown below:

Column 16, line 28, after "without" delete "the".

Signed and Sealed this

Fourteenth Day of December, 1993

Attest:

BRUCE LEHMAN

Attesting Officer     Commissioner of Patents and Trademarks